United States Patent [19]

Thomas

[11] 4,070,618

[45] Jan. 24, 1978

[54] DIGITAL PHASE AND FREQUENCY METER

[75] Inventor: Elmer L. Thomas, Placentia, Calif.

[73] Assignee: Chevron Research Company, San Francisco, Calif.

[21] Appl. No.: 731,971

[22] Filed: Oct. 14, 1976

[51] Int. Cl.$^2$ ............................................. G01R 23/02
[52] U.S. Cl. ................................ 324/78 D; 324/83 D; 324/79 D
[58] Field of Search ............... 324/78 D, 79 D, 78 Z, 324/83 R, 83 D

[56] References Cited

U.S. PATENT DOCUMENTS 4,014,242 3/1977 Sanderson .......................... 324/79 D Primary Examiner—M. Tokar Attorney, Agent, or Firm—R. L. Freeland, Jr.; H. D. Messner

[57] ABSTRACT

Phases are measured with a resolution of one degree, and frequencies are measured with a resolution of 0.01 Hz by the same circuitry. An internal voltage-controlled oscillator (VCO) is forced to operate at 360 times the frequency of the incoming test signal by use of a phase-locked loop and a 360 divider. Clock pulses from the VCO are counted throughout an interval of noncoincidence of the original test signal and any phase-shifted version of that test signal, and the count is digitally displayed directly as phase shift in degrees. Clock pulses from the VCO are counted throughout an interval of (1/3.6) second and the resulting count is digitally displayed with the last two digits marked off by a decimal point, as the frequency.

10 Claims, 3 Drawing Figures

FIG. 1

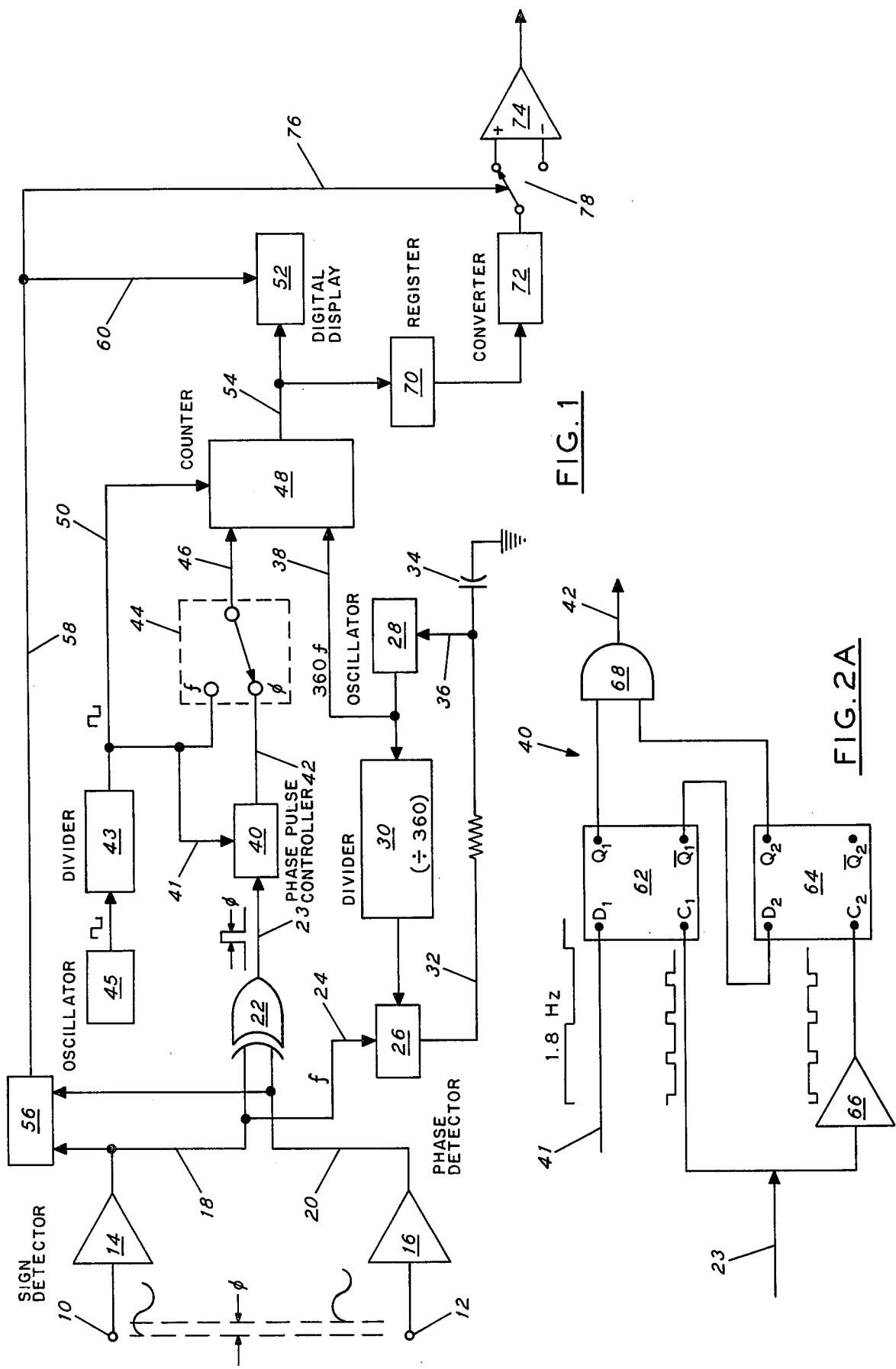

DIGITAL PHASE AND FREQUENCY METER

FIELD OF THE INVENTION

The invention is useful in the measurement of both the phases and the frequencies of alternating electrical currents. It is particularly useful in the sub-audio and low audio range (1 to 1000 Hz) which is encountered in seismic exploration equipment testing.

STATE OF THE ART

In the testing of electrical equipment, in the audio and sub-audio frequency range, for example, in the seismic exploration industry, the measurement of phase shift often becomes desirable. Those commercially available phase shift measuring instruments that are capable of handling sub-audio frequencies are large, laboratory-type instruments, too cumbersome for field use. The present invention makes available a small, highly portable, phase-measuring meter capable of one degree resolution, and also capable of 0.01 Hz resolution as a frequency meter, with quartz crystal reference accuracy.

BRIEF DESCRIPTION OF THE DRAWINGS

FIG. 1 is a block diagram of circuitry useful in carrying out the present invention;

FIG. 2A is a block diagram of a phase pulse controller used in the circuit of FIG. 1.

DETAILED DESCRIPTION OF THE PRESENT INVENTION

Figure 2B:
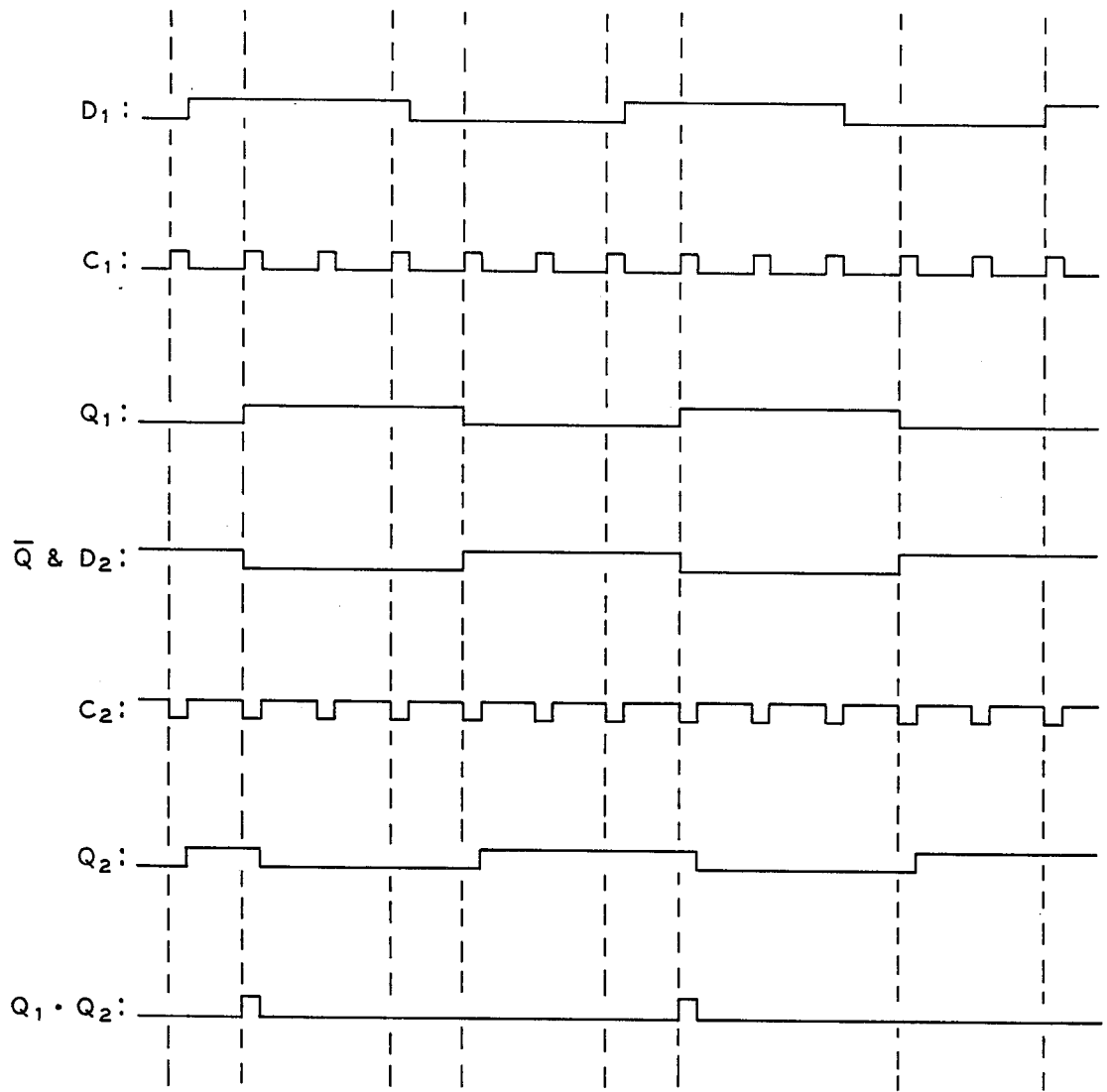
FIG. 2B is a waveform diagram illustrating operation of the invention.

Referring to FIG. 1, terminals 10 and 12 are the input terminals of the meter. Into terminal 10 is fed what may be called, for present convenience, the test input voltage. It may be, for example, a sinusoidal voltage proportional to, and in phase with, a current that is being fed into a geophone. Into terminal 12 is fed the unknown phase-shifted input voltage. Corresponding to the test input voltage, the unknown phase-shifted input voltage may be, for example, a sinusoidal voltage proportional to the voltage out of the above-mentioned geophone when the above-mentioned current is fed into it. In such a case, the object of the test being made with the meter of the present invention would be to determine the phase lag of that output voltage with respect to the input current. The waveforms shown in FIG. 1 between terminals 10 and 12 represent the test input and the unknown phase input and their phase angle difference, $\phi$. Amplifiers 14 and 16 amplify the test input voltage and the unknown phase-shifted input voltage, respectively, by large factors (e.g. 70,000) and clip the outputs so that both inputs become essentially square wave outputs whose vertical upgoing fronts correspond to the upgoing zero crossings of the original input waves, and whose vertical downgoing edges correspond to the down-going zero crossings of the original input waves. From amplifiers 14 and 16, the two square waves travel through leads 18 and 20 respectively to the exclusive OR gate 22, out of which comes a square pulse whose duration necessarily represents the duration of the non-coincident parts of the two waveforms entering exclusive OR gate 22, and therefore must represent the phase difference of the original two sinusoidal voltages that were applied to terminals 10 and 12.

The square pulse representing the phase difference between the two original input waves eventually serves as a gate that lets through a number of voltage pulses occurring with a pulse repetition rate 360 times the frequency of those original input waves, and the description will now turn toward the generation of those pulses. Lead 24, branching from lead 18, impresses the square wave voltage from amplifier 14 upon phase detector 26, which is connected in a loop with voltage-controlled oscillator (VCO) 28, and divider 30 (which divides the frequency out of VCO 28 by 360).

In phase detector 26, the square wave from divider 30 is compared with the square wave from amplifier 14. If the phase of the voltage from divider 30 is behind that from amplifier 14, positive pulses are sent through lead 32 to capacitor 34, building up its charge, causing more voltage to be applied through lead 36 to VCO 28, causing the frequency generated in VCO 28 to increase. If the phase of the voltage from divider 30 is ahead of that from amplifier 14, the opposite effect occurs. As a result, the two voltages fed into phase detector 26 soon become "phase-locked" and the frequency of the voltage out of VCO 28 becomes exactly 360 times that of the voltage out of amplifier 14, which is, of course, also the frequency of the original reference input voltage applied to terminal 10.

Circuit elements such as those in the loop just described are well known in the electronic art. Elements like phase detector 26 and VCO 28 may be found together on a single chip, e.g., Motorola MC14046.

At this point it will be appreciated that the essentials are present for a digital indication of the phase. A square pulse comes out of exclusive OR gate 22 whose width represents the phase difference between the two original input waves; and positive voltage pulses come out of VCO 28, one for each phase degree of the original input waves. Basically then, it is only necessary to count how many positive pulses from VCO 28 occur during one individual pulse out of OR gate 22. However, the ultimate display of the results must be convenient for human observation and comprehension; and it would not always be convenient and comprehensible if the display time interval and the time interval between updatings of the display were proportional to the period of the voltage being measured. For convenient observation and comprehension, each set of numbers in the numerical display needs to remain constant for a time interval of the order of one second. So, in the meter of the present invention, an auxiliary clock signal, coming from a constant frequency crystal time base, controls further passage of the phase difference pulses out of exclusive OR gate 22. Whatever the period of the test input voltage, the phase pulse controller 40 allows one and only one complete phase difference pulse to pass during each one of a set of succeeding time intervals, each (1/1.8) second long. (This interval, 1/1.8 second, is sufficiently near one second to make the changes of the subsequent counter comprehensible, and it was chosen because of its convenient relationship to the interval 1/3.6 second to be used, as will be described later, for counting the pulses that indicate frequency.)

The auxiliary clock signal (the 1.8 Hz square wave that is fed into phase pulse controller 40) originates in quartz crystal oscillator 45, which in the present embodiments of this invention has a chosen frequency of 450 KHz. A 450 KHz square wave coming out of oscillator 45 is fed into divider 43, which divides its frequency by 250,000 to produce the required 1.8 Hz square wave.

Referring now to FIG. 2A in which are represented the operating elements of phase pulse controller 40, and to FIG. 2B in which are represented the relevant electrical waveforms. The 1.8 Hz square wave is fed into data terminal $D_1$ of D-flip-flop, 62. The noncoincidence pulses from exclusive OR gate 22 are fed into clock terminal $C_1$ of D-flip-flop 62. The state of the voltage from output terminal $Q_1$ changes to the state impressed on the data terminal, $D_1$, but only when the voltage on the clock terminal has a rising edge. So, as shown in FIG. 2B, the first noncoincidence pulse that begins after the positive state has been impressed on terminal $D_1$ changes the output at $Q_1$ to a positive state. At the same time, it changes the output from complementary output terminal, $\overline{Q}_1$, to a zero state. The voltage from output terminal $Q_1$ is fed to AND-gate 68, and the voltage from complementary output terminal, $\overline{Q}_1$, is fed into the data terminal of another D-flip-flop, 64.

Into the clock terminal, $C_2$, of D-flip-flop 64, there is fed an inverted version of the train of noncoincidence pulses coming through lead 23 from exclusive OR-gate 22. The inversion is performed by inverting amplifier 66. The voltage at the output terminal, $Q_2$, of D-flip-flop 64 must assume the state impressed upon the data terminal $D_2$ at the time of the first rising edge of the pulse train fed into clock terminal $C_2$ that occurs after the state at $D_2$ has changed. As shown in FIG. 2B, this rising edge will necessarily correspond in time to the falling edge of the pulse that caused the first change of state shown in D-flip-flop 62. The output from terminal $Q_2$ then will have been in its positive state before and during the time when the output from $Q_1$ assumed its positive state. But the output from terminal $Q_2$ will fall to zero at the trailing edge of that same noncoincidence pulse. Now, if the waves from output terminals $Q_1$ and $Q_2$ are fed into AND-gate 68, the output, labeled $Q_1 \cdot Q_2$ in FIG. 2B, must necessarily emit one, and only one, complete pulse, whose width is that of one non-coincidence pulse, in each positive half wave of the 1.8 Hz square wave that is fed into $D_1$.

Further consideration of FIG. 2 will make apparent the way in which the above-described sequences must repeat themselves during further positive half-cycles of the 1.8 Hz square waves.

The parts of the apparatus described up to this point produce a square voltage pulse out of phase pulse controller 40 into lead 42, which pulse has a width representing the actual phase difference between the test input voltage (applied to terminal 10) and the phase-shifted input voltage (applied to terminal 12). One of these pulses, and only one, is emitted from phase pulse controller 40 about every 1/1.8 second. This pulse goes through switch 44 (shown in FIG. 1 in its phase-measuring position) and on through lead 46 to counter 48 where the pulse serves to gate the pulses coming through lead 38 to counter 48. It will be appreciated that if the gating pulses going into counter 48 through lead 46 cause the counter to count during the actual time interval of phase difference between the test input voltage and the phase-shifted input voltage, and the pulses to be counted, coming in through lead 38, are occurring at 360 times the frequency of the test input voltage, one for each phase degree, then during each gating pulse, the number of the faster pulses from lead 38 that are counted will be equal to the phase difference in degrees.

The same 1.8 Hz square wave, whose positive portion served as the envelope that permitted the passage of one, and only one, gating pulse through phase pulse controller 40 every 1/1.8 seconds, also serves as the transfer and reset signal for counter 48. It is evident from the preceding description that the counting of the phase degree pulses occurred during the positive part of the 1.8 Hz square wave. That square wave entering the counter through lead 50 signals the counter to transfer its count to digital display 52 and then to reset itself during the negative (or zero level) part of the 1.8 Hz square wave.

Various circuits that can cause stored counts to be transferred to digital displays are well known in the present electronic art. The only detail that might be considered peculiar to the present invention is the way in which the sign of the phase difference is detected and transmitted to the display. In the present embodiments, sign detector 56 contains a D-flip-flop whose data terminal (D-terminal) receives the square wave version of the test input voltage out of amplifier 14, and whose clock terminal (C-terminal) receives the square wave version of the phase-shifted input voltage. If the phase-shifted voltage lags the test input voltage, the complementary output terminal of the D-flip-flop ($\overline{Q}$ terminal) will assume its low, or zero state. If the phase-shifted voltage leads the test input voltage, the complementary output terminal ($\overline{Q}$ terminal) will assume its high state. The low state voltage transmitted through leads 58 and 60 to display 52 causes the display to prefix a negative sign to its count, and the high state voltage prefixes no sign, implying, of course, that the displayed number is positive.

The description has now covered the phase measuring and displaying operations of the meter of the present invention. The frequency measuring and displaying operations remain to be described; but all the essential elements used in those frequency measuring operations have already been at least mentioned in connection with the phase measuring operations.

For frequency measurement and display, the switch 44 is put into its frequency measuring position: upward on the diagram of FIG. 1. Then instead of the noncoincidence pulses fed into counter 48 during the phase-measuring operation, 1.8 Hz square waves will be fed into the gating terminal of counter 48. The positive halves of the 1.8 Hz square wave must be (1/3.6) second long. If pulses coming into counter 48 at a rate 360 times the frequency of the test input voltage are counted during a gate time of (1/3.6) second, the count during that gate time must be numerically equal to 100 times the frequency of the test input voltage. This count is displayed on display 52 with the two right hand places marked off with a decimal point, so the displayed reading is in Hertz with a resolution of 0.01 Hertz.

It will be appreciated that when the meter is operating as a frequency meter, it is not necessary that there be two voltage inputs. One test input voltage, whose frequency is to be measured, is connected to terminal 10.

Now both the phase and frequency measuring and the displaying operations of the meter of the present invention have been described. These are the functions that impart to the meter its chief utility. However, occasions arise when it is useful also to make analog plots of a varying phase or varying frequency. Only a few additional elements, well known in the electronic art, need to be added to attain that further advantage. Either the phase or the frequency indication exists as a digital quantity in the counter 48. This digital quantity is stable, in fact unchanging, for time intervals of (1/1.8) second.

The digital count is transferred to register 70, which in turn passes its registered data to the digital-to-analog converter 72. Out of digital-to-analog converter 72 come stable analog voltages that are fed into amplifier 74, whose output is capable of feeding whatever type of plotter is desired to be connected to the meter. In the existing embodiments of the present invention there is also a lead 76 coming from sign detector 56 that operates a relay switch 78 to switch the voltage input between a positive and a negative input terminal so that when phase is being measured, a negative or a positive voltage may be applied by amplifier 74 to the connected plotter.

While specific examples have been utilized in this specification to demonstrate the method of my invention, it is intended that the scope of my invention be limited only by the scope and spirit of the appended claims.

What is claimed is:

1. Method of determining the phase difference between two low audio or sub-audio frequency sinusoidal voltages of identical frequency, one a test input voltage and the other a phase-shifted input voltage, comprising the steps of:
   a. generating a first square wave whose vertical upgoing edges correspond to the upward-going zero crossings of said test input voltage and whose vertical downgoing edges correspond to the downward-going zero crossings of said test input voltage, and generating a second square wave whose vertical upgoing edges correspond to the upward-going zero crossings of said hase-shifted input voltage and whose vertical downgoing edges correspond to phase-shifted downgoing zero crossings of said phase-shifted input voltage, also generating a series of voltage pulses whose repetition rate is 360 times said identical frequency of said two sinusoidal voltages whose phase difference is to be measured;
   b. generating from said first and second square waves a series of square pulses whose width is equal to the noncoincidence interval of said first and second square waves;
   c. selecting one and only one complete noncoincidence pulse during each one of a set of succeeding time intervals, each 1/1.8 second long;
   d. counting the number of degree pulses occurring throughout each selected noncoincidence pulse; and
   e. displaying the count as the degrees of phase difference of said measured voltages.

2. The method of claim 1 in which the count for each selected noncoincidence pulse is displayed unchanged throughout an interval of 1/1.8 second, and then replaced by the count for its succeeding noncoincidence pulse.

3. Method of determining either phase difference between or frequency of two low audio or sub-audio frequency sinusoidal voltages of identical frequency, one a test input voltage, and the other a phase-shifted input voltage, comprising the steps of:
   a. generating a first square wave whose vertical upgoing edges correspond to the upward-going zero crossings of said test input voltage and whose vertical downgoing edges correspond to downward-going zero crossings of said test input voltage and generating a second square wave whose vertical upgoing edges correspond to the upward-going zero crossings of said phase-shifted input voltage and whose vertical downgoing edges correspond to the downgoing zero crossings of said phase-shifted input voltage, also generating a series of voltage pulses whose repetition rate is a constant 360C times said identical frequency of said two sinusoidal voltages, where each such pulse represents 1/C degree;
   b. generating from said first and second square waves a series of square pulses each having a width equal to a non-coincidence interval of said first and second square waves;
   c. selecting one and only one complete noncoincidence pulse during each one of a first set of succeeding time intervals, each of an order of a second long;
   d. counting the number of fractional degree pulses occurring throughout either (i) each selected noncoincidence pulse or (ii) each one of a second set of succeeding time intervals where each one of said second set of time intervals is $10^N/360C$ second long where N is the number of decimal places to which frequency is to be displayed;
   e. displaying the count of step (d) as either phase difference between or frequency of said two voltages.

4. The method of claim 3 in which constant C of step (a) is equal to 1; each of said voltage pulses represents one degree and in which the number of degree pulses counted are only over (i) of step (d) so that the displayed count of step (e) is the phase difference between said two sinusoidal voltages.

5. The method of claim 4 in which each one of said first set of succeeding time intervals of step (c) is 1/1.8 second long.

6. The method of claim 5 in which the count for each selected noncoincidence pulse of step (d) is displayed unchanged throughout an interval of 1/1.8 second and then replaced by the count for the next selected noncoincidence pulse so as to repetitively display the count as the degrees of phase difference of said measured voltages.

7. The method of claim 3 in which said constant C of step (a) is equal to 1; each of said voltage pulses repesents one degree and in which said second time interval is 1/3.6 second long whereby the count is displayed to two decimal places in step (e) as the frequency of said two voltages.

8. The method of claim 7 in which the count displayed to two decimal places in step (e) is displayed unchanged throughout an interval of 1/1.8 second and then replaced so as to repetitively display the count as frequency to two decimal places.

9. A circuit for determining both the phase difference and the frequency of two low-audio-frequency sinusoidal voltages of identical frequency, one a test input voltage and the other a phase-shifted input voltage, comprising,
   a. means for generating a first square wave whose vertical upgoing edges correspond to the upward-going zero crossings of said test input voltage and whose vertical downgoing edges correspond to the downward-going zero crossings of said test input voltage, and for generating a second square wave whose vertical upgoing edges correspond to the upward-going zero crossings of said phase-shifted input voltage and whose vertical downgoing edges correspond to the downgoing zero crossings of said phase-shifted input voltage;

b. additional means for generating a series of voltage pulses whose repetition rate is 360 times said identical frequency;

c. means for generating from said first and second square waves, a series of square pulses whose width is equal to the noncoincidence interval of said first and second square waves;

d. means for generating an auxiliary clock signal square wave of constant period, 1/1.8 second;

e. means for selecting one and only one complete noncoincidence pulse during each period of said auxiliary clock signal;

f. means for selecting between (i) said auxiliary clock signal square wave of (d) or (ii) said one and only one complete noncoincidence pulse of (e) depending upon whether frequency or phase difference, respectively, is to be indicated;

g. means for counting the number of degree pulses occurring either (i) during each positive half of said auxiliary clock signal square waves of (d) or (ii) during each one of said selected noncoincidence pulse of (e); and h. means for displaying the count either as frequency if (i) of step (f) is selected, or as phase difference if (ii) of step (f) is selected.

10. The circuit of claim 9 in which (f) is a single-pole, double-throw switch.

* * * * *